(12) United States Patent
Yanduru et al.

(10) Patent No.: US 10,103,690 B2
(45) Date of Patent: Oct. 16, 2018

(54) PHASE, AMPLITUDE AND GATE-BIAS OPTIMIZER FOR DOHERTY AMPLIFIER

(71) Applicants: Naveen Yanduru, San Diego, CA (US);
 Chris Stephens, San Jose, CA (US);
 Jean-Marc Mourant, Dunstable, MA (US); Chuying Mao, Westford, MA (US)

(72) Inventors: Naveen Yanduru, San Diego, CA (US);
 Chris Stephens, San Jose, CA (US);
 Jean-Marc Mourant, Dunstable, MA (US); Chuying Mao, Westford, MA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/218,539

(22) Filed: Jul. 25, 2016

(65) Prior Publication Data
 US 2018/0026583 A1 Jan. 25, 2018

(51) Int. Cl.
 *H03F 1/02* (2006.01)
 *H03F 3/213* (2006.01)
 (Continued)

(52) U.S. Cl.
 CPC ........... *H03F 1/0288* (2013.01); *H03F 1/301* (2013.01); *H03F 3/195* (2013.01); *H03F 3/213* (2013.01);
 (Continued)

(58) Field of Classification Search
 USPC .................... 330/295, 124 R, 84, 286, 53–54
 See application file for complete search history.

(56) References Cited

U.S. PATENT DOCUMENTS

| | | | |
|---|---|---|---|
| 9,647,611 B1 * | 5/2017 | Embar | H03F 1/0288 |
| 2016/0094187 A1 * | 3/2016 | Staudinger | H03F 1/0288 330/295 |

OTHER PUBLICATIONS

Freescale Semiconductor, Inc., Advanced Doherty Alignment Module (ADAM), Document No. MMDS20254H, Rev. 2, Jan. 2015, pp. 1-16.
(Continued)

*Primary Examiner* — Hieu Nguyen
(74) *Attorney, Agent, or Firm* — Tracy Parris

(57) ABSTRACT

Systems, methods and instrumentalities are disclosed for Doherty amplifier optimization. Amplifier configurability and control therefore may be integrated. Amplitude alignment, phase alignment, amplifier gate biasing, driver gate biasing and temperature compensation for N paths in Doherty configurations may be integrated, for example, using a programmable LUT storing control bit patterns. Configurability may comprise reconfigurability between asymmetric power split ratios, between symmetric and asymmetric relationships and between classic and inverted phase relationships, permitting path reconfigurability for higher or lower power and leading or lagging phase. Multiple versions providing more or less configurability and/or control range with more or less insertion loss, such as design and production versions, may be pin compatible, e.g., to reduce time and expense for R&D and production transition. Integration of configurability and/or control may reduce complexity in design, development, control, optimization, production and application, e.g., by eliminating interfaces, mismatches or excessive capacitance between discrete chips.

20 Claims, 3 Drawing Sheets

(51) Int. Cl.
*H03F 1/30* (2006.01)
*H03F 3/195* (2006.01)

(52) U.S. Cl.
CPC .... *H03F 2200/18* (2013.01); *H03F 2200/192* (2013.01); *H03F 2200/451* (2013.01)

(56) References Cited

OTHER PUBLICATIONS

Peregrine Semiconductor Corp., PE46120 Product Specification, DOC-54655-6, May 2015, pp. 1-25.

* cited by examiner

PHASE, AMPLITUDE AND GATE-BIAS OPTIMIZER FOR DOHERTY AMPLIFIER

CROSS REFERENCE TO RELATED APPLICATIONS

This application claims priority to U.S. Provisional Patent Application No. 62/270,883, filed on Dec. 22, 2015, and entitled "PHASE, AMPLITUDE AND GATE-BIAS OPTIMIZER FOR DOHERTY AMPLIFIER," the entirety of which is incorporated by reference as if fully set forth herein.

BACKGROUND

Doherty amplifiers use load modulation to improve efficiency. However, relative to other amplifier architectures, Doherty amplifiers are difficult to design and operate in modern applications.

SUMMARY

This Summary is provided to introduce concepts in a simplified form. These concepts are described in greater detail below in the sections entitled Detailed Description Of Illustrative Embodiments, Brief Description of the Drawings, Claims, and in the figures. This Summary is not intended to identify key or essential features of the described or claimed subject matter, nor limit the scope thereof.

Systems, methods and instrumentalities are disclosed for Doherty amplifier optimization. Amplifier configurability and control therefore may be integrated. Amplitude alignment, phase alignment, amplifier gate biasing, driver gate biasing and temperature compensation for N paths in Doherty configurations may be integrated, for example, using a programmable look up table (LUT) or other form or memory storing control bit patterns. Configurability may comprise reconfigurability between asymmetric power split ratios, between symmetric and asymmetric relationships and between classic and inverted phase relationships, permitting path reconfigurability for higher or lower power and leading or lagging phase. Multiple versions providing more or less configurability and/or control range with more or less insertion loss, such as design and production versions, may be pin compatible, e.g., to reduce time and expense for R&D and production transition. Integration of configurability and/or control may reduce complexity in design, development, control, optimization, production and application, e.g., by eliminating interfaces, mismatches or excessive capacitance between discrete chips.

BRIEF DESCRIPTION OF THE DRAWINGS

The drawings, summary, detailed description and claims individually and collectively present non-limiting examples. Each figure represents a different example with different numbering.

DETAILED DESCRIPTION

Figure 1:
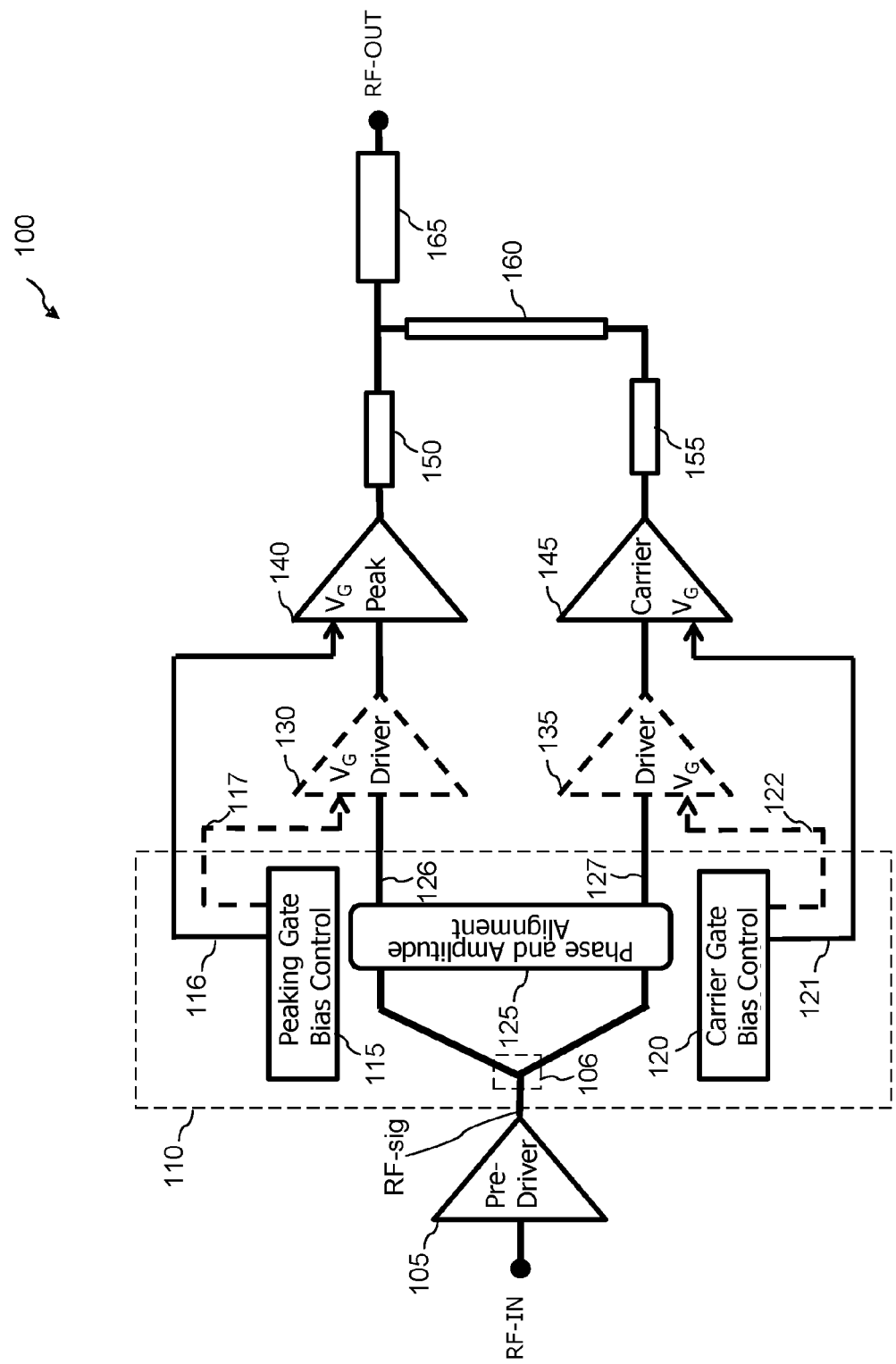
FIG. 1 is an example of a Doherty amplifier with configurable architecture and control circuitry.

A detailed description of illustrative embodiments will now be described with reference to the various Figures. Although this description provides examples of possible implementations, it should be noted that details provided in examples are intended to be exemplary and in no way limit the scope of the application. The present technology may be practiced without these specific details. The present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example embodiment," or the like, indicate that the embodiment described may include a particular feature, structure, characteristic or step, but every embodiment may not necessarily include the particular feature, structure, characteristic or step. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

Unless specifically stated otherwise, terms such as "sampling," "latching," "determining," "selecting," "storing," "registering," "creating," "including," "comparing," "receiving," "providing," "generating," "associating," and "arranging", or the like, refer to the actions and processes of an electronic device that manipulates and transforms data represented as physical (electronic) quantities within the electronic device. The terms "logic," "function," "step," and the like refer to functionality that may be implemented by hardware (digital and/or analog) or a combination of hardware, software and/or firmware. Unless specifically indicated, described and claimed functionality may be implemented by hardware (digital and/or analog) or a combination of hardware, software and/or firmware. The term "programmable" and the like refer to functionality permitting definition or selection of functionality to vary performance of logic from one embodiment to the next, whether one-time or any number of times such as by reprogrammable functionality. Logic may be referred to as being enabled, disabled, high, low, on, off and the like.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection or through an indirect electrical connection via other devices and connections. Furthermore, the term "information" is intended to refer to any data, instructions, or control sequences that may be communicated between components of a device. For example, if information is sent between two components, data, instructions, control sequences, or any combination thereof may be sent between the two components. The terms constant, substantially constant, maintain and substantially maintain are used interchangeably to have the same meaning of constant +/−10% variation. Maintenance of an impedance value permits some variation from the impedance value, but considerably less variation than impedance glitches during normal switching.

Doherty amplifier configurability and control therefore may be integrated. Amplitude alignment, phase alignment, amplifier gate biasing, driver gate biasing and temperature compensation for N paths in Doherty configurations may be integrated, for example, using a programmable LUT storing control bit patterns. Configurability may comprise reconfigurability between asymmetric power split ratios, between symmetric and asymmetric relationships and between classic and inverted phase relationships, permitting path reconfigurability for higher or lower power and leading or lagging phase. Multiple versions providing more or less configurability and/or control range with more or less insertion loss, such as design and production versions, may be pin compatible, e.g., to reduce time and expense for R&D and production transition. Integration of configurability and/or control may reduce complexity in design, development, control, optimization, production and application, e.g., by eliminating interfaces, mismatches or excessive capacitance between discrete chips.

FIG. 1 is an example of a Doherty amplifier with configurable architecture and control circuitry. A Doherty amplifier provides load modulation. Load modulation may be provided, for example, by allowing load impedance to vary, e.g., as a function of signal power. Load modulation may improve efficiency under back off conditions. Load modulation may allow more efficient use of a fixed supply voltage under signal back OFF conditions, e.g., when signal power is below maximum power.

Doherty amplifiers may be used for modern communication protocols with amplitude modulation where signals have high signal power peak to average ratios (PARs). Doherty amplifiers may be sensitive, so, performance may vary with variations in process, frequency, temperature, aging and signal power PAR. Doherty amplifiers are difficult to design. The design process is cumbersome and manual. Doherty amplifiers are difficult to program for varying signal conditions (e.g. PARs), output power, etc. Doherty amplifiers lack the kind of digital intelligence offered by competing architectures, such as envelope tracking, digital power amplifiers (Pas) and polar loop architectures.

Doherty amplifier 100 is presented as an example and does not limit the disclosure to a particular type or implementation of a Doherty amplifier. There are a variety of types and implementations of a Doherty amplifier. For example, a Doherty amplifier may be symmetric or balanced. A Doherty amplifier may be asymmetric or unbalanced. A peaking amplifier may receive more power from an input hybrid coupler, for example, in an unbalanced implementation.

A Doherty amplifier may have two or more paths. A first path may be referred to as a main or carrier path and a second path may be referred to as an auxiliary or peaking path. A main (carrier) path may amplify lower power portions of a signal while an auxiliary (peaking) path may amplify higher power portions of a signal. An N-Path Doherty implementation may, for example, have multiple peaking paths. In an example of a Doherty amplifier with multiple peaking paths, a peak back OFF efficiency may be achieved at multiple back OFF powers.

A Doherty Amplifier may be implemented, for example, as a standard Doherty amplifier or an inverted Doherty amplifier. An inverted Doherty amplifier may be used, for example, when the electrical length of offset lines exceeds that of lambda/4 (i.e. ¼λ). An Offset line length may be decreased by ¼λ, e.g., instead of having long offset lines, and a corresponding swap of the location of the impedance inverter may be implemented, for example, to implement an inverted Doherty amplifier. An inverted Doherty architecture may be used at an output. An input hybrid coupler may be swapped, for example, to align the 90 degree phase with the location of an impedance inverter at the output.

In an example, Doherty amplifier 100 may comprise carrier amplifier 145 and peaking amplifier 140 in their respective carrier and peaking paths. An example implementation may comprise a peaking driver 130 in the peaking path and a carrier driver 135 in the carrier path. Carrier path driver 135 and amplifier 145 may be controlled, at least in part by, carrier path gate bias control 120. Peaking path driver 130 and amplifier 140 may be controlled, at least in part by, peaking path gate bias control 115. Also shown in the example in FIG. 1 is phase and amplitude alignment 125, which may be used to align phase and/or amplitude of carrier and/or peaking path signals. Doherty amplifier 100 may also comprise pre-driver 105 and hybrid coupler 106, e.g., to split input signal RF-IN. Doherty amplifier may also comprise a Doherty output combiner, which may be composed of offset lines 150 and 155, impedance inverter 160 and load matching transmission line 165. Other examples and implementations of a Doherty amplifier may comprise the same or different, more or fewer components in the same or different configurations that implement the described technology.

In an example, a back OFF efficiency peak may be realized at greater back OFF than 6 dB, for example, in an unbalanced implementation. In an example, a Doherty amplifier 100 may be optimized, for example, for PARs ranging from 9.5 dB to 6 dB.

Pre-Driver 105 may comprise an amplifier in a transmit (TX) chain, the output of which may be provided to a hybrid coupler. Pre-driver 105 may amplify a transmit signal (e.g. input signal RF-IN) before providing the transmit signal to a driver stage.

In an example (e.g. alternative implementation), output of pre-driver 105 may be provided (e.g. directly or indirectly) to a driver implemented before a power splitter/hybrid coupler, for example, in addition to or to avoid multiple drivers in carrier and peaking paths, such as peaking driver 130 and carrier driver 135.

Pre-driver 105 may be integrated, e.g., with configuration, control and optimization circuitry 110 and/or other Doherty components, or may stand alone. Pre-driver 105 may, for example, be designed and implemented in GaAs technology. Pre-driver 105 may be implemented, for example, using RF SOI (Silicon on Insulator) technology. Pre-driver 105 may be implemented with digital logic and control, CMOS based and digital control, etc.

Pre-driver 105 may comprise a wideband amplifier covering multiple RF bands, e.g., low bands (~700 MHz) to high bands (~2700 MHz). Wideband performance may or may not be accompanied by external matching networks.

Pre-driver 105 may have a fixed or variable bandwidth that may be statically or dynamically variable, e.g., programmable. Pre-driver 105 may comprise a wide-band amplifier, e.g., covering 700 MHz to 2700 MHz, which may be fixed or variable. For example, pre-driver 105 may have a narrower bandwidth (e.g. 300 to 400 MHz wide) that may be varied, e.g., by programming, to provide a wider overall range, such as 700 MHz to 2700 MHz. In an example, for a given programming condition, pre-driver 105 may have 300-400 MHz or other subrange of bandwidth sufficient to cover specified RF band reception, while having a wider overall bandwidth considering multiple variation (e.g. programming) conditions. An RF SOI based pre-driver may have low loss and/or high linearity switches that may introduce minimal insertion loss or other RF performance degradation in a signal path.

Signal path divider 106 may split a signal for processing by carrier and peaking paths. Signal path divider 106 may comprise a coupler and/or a power splitter to split (e.g. pre-driven) input signal RF-signal into multiple (N) paths, such as carrier and peaking paths. N may be, for example, 2, 3, etc. The split may be accompanied, for example, by no phase shift or a 90 degree phase shift between the carrier and peaking paths. For example, the peaking path may lag the carrier path by 90 degrees. Signal path divider 106 may comprise, for example, a Wilkinson or branch line coupler. Signal path divider 106 may be implemented, for example, by discrete modules or physical transmission lines. In another example, signal path divider 106 may be implemented, for example, by an integrated Circuit (IC) based implementation. An IC-based implementation may, for example, use lumped component equivalents of transmission lines using inductors and capacitors on chip. In other examples, hybrid coupler 106 may comprise a reflective type phase shifter or coupler architecture.

Configuration, control and optimization circuitry 110 may permit configuration of a Doherty amplifier, e.g., for classic or inverted, symmetric or asymmetric operation, and may provide configurable control and optimization for various configurations. Configuration, control and optimization circuitry 110 indicates an example set of circuitry that may be conducive for integration (e.g. monolithic implementation), such as in one integrated circuit, multi-chip module (MCM), etc. Circuitry 110 may comprise, for example, the input splitter (e.g. 106), optimization controls for Doherty functionality (e.g. phase and amplitude alignment 125) and gate bias generation (e.g. peaking and carrier gate bias control 115, 120). In another example, a monolithic implementation of circuitry 110 may (e.g. also) comprise drivers (e.g. peaking and carrier drivers 130, 135) into the same monolithic implementation. In another example, a monolithic implementation of circuitry 110 may (e.g. also) comprise a pre-driver (e.g. pre-driver 105) and other post transceiver circuitry in the transmit path.

Doherty amplifier 100 may be implemented with several variations of configuration, control and optimization circuitry 110, e.g. a design/development version and a production version. A design/development version may have, for example, greater dynamic range and/or expanded configurability than a production version. Multiple versions may be pin compatible, e.g., to simplify R&D and the transition to production.

Peaking gate bias control 115 may provide peaking amplifier gate bias 116 for peaking amplifier 140 and peaking driver gate bias 117 for peaking driver 130. Peaking amplifier gate bias 116 may comprise, for example, an analog gate bias voltage. Peaking driver gate bias 117 may comprise, for example, an analog gate bias voltage. Peaking gate bias control 115 may comprise, for example, gate bias generation, supply sequencing and digital to analog converters (DACs) for the peaking path. Peaking gate bias control 115 may be controlled, for example, by one or more control signals. Peaking gate bias control 115 may provide a variable or flexible (e.g. statically or dynamically programmable) bias voltage to peaking driver and amplifier 130, 140 to control their respective class of operation. Peaking gate bias control 115 may (e.g. also) provide the drain bias control and bias sequencing (if any) between drain and gate bias voltages, e.g., to provide or improve reliable amplifier operation when depletion mode transistors are used in peaking driver and/or amplifier 130, 140.

Carrier gate bias control 120 may provide carrier amplifier gate bias 121 for carrier amplifier 145 and carrier driver gate bias 122 for carrier driver 135. Carrier amplifier gate bias 121 may comprise, for example, an analog gate bias voltage. Carrier driver gate bias 122 may comprise, for example, an analog gate bias voltage. Carrier gate bias control 120 may comprise, for example, gate bias generation, supply sequencing and DACs for the carrier path. Carrier gate bias control 120 may be controlled, for example, by one or more control signals. Carrier gate bias control 120 may provide a variable or flexible (e.g. statically or dynamically programmable) bias voltage to carrier driver and amplifier 135, 145 to control their respective class of operation. Carrier gate bias control 120 may (e.g. also) provide the drain bias control and bias sequencing (if any) between drain and gate bias voltages, e.g., to provide or improve reliable amplifier operation when depletion mode transistors are used.

Phase and amplitude alignment 125 may comprise one or more circuits that may be used to align the phase and amplitude of signals between the carrier and peaking paths. Phase and amplitude alignment 125 may receive split signals, e.g., from hybrid coupler 106. Phase and amplitude alignment 125 may provide peaking path signal 126 and carrier path signal 127. Phase and amplitude control 125 may control signal phases and amplitudes on peaking and carrier path signals 126, 127 and may (e.g. also) provide symmetric or asymmetric support for symmetric or asymmetric Doherty function in a symmetric or asymmetric architecture. Phase and amplitude alignment 125 may be used to compensate peaking and/or carrier path signals 126, 127 for any non-idealities, process variations, temperature variations, operational and/or signal (e.g. voltage) variations. For example, phase and amplitude control 125 may set different values, e.g., make different adjustments to peaking and/or carrier path signals 126, 127, for different signal frequencies, etc. Phase and amplitude alignment 125 may have high(er) or low(er) power handling capabilities. Phase and amplitude alignment 125 may be placed before or after a driver, for example, depending on power handling capability. Similarly, a driver may be implemented before or after a power divider (e.g. hybrid coupler), for example, based on power handling capability.

In an example, a back OFF efficiency peak may be realized at greater back OFF than 6 dB, for example, in an unbalanced implementation. In an example, a Doherty amplifier 100 may be optimized, for example, for PARs ranging from 9.5 dB to 6 dB. Doherty amplifier 100 may be implemented, for example, with a 3.5 dB insertion loss control (e.g. attenuation control) in the peaking path.

In an example, phase alignment may be, for example, continuous or discrete, such as increments of 1, 2, 3, 4, 5, etc. degrees. A phase alignment range may be, for example, 35 degrees in carrier and peaking paths. In an example, amplitude control may be continuous or discrete, e.g., 0.5 dB steps. In an example, a peaking path signal 126 may have an amplitude range of −3.5 dB to −7 dB and a phase range of −90 to −125 degrees. A carrier path signal 127 may have an amplitude range of −6.5 dB (e.g. fixed at −6.5 dB) and a phase range of 0 to −35 degrees.

Peaking driver 130 may receive peaking path signal 126 and peaking driver gate bias 117, e.g., from phase and amplitude alignment 125. Peaking driver 130 may amplify peaking path signal 126. Performance of peaking driver 130 may be controlled, at least in part, by peaking driver gate bias 117. Peaking driver 130 may be optional in some implementations. Peaking driver 130 may be implemented, for example, when phase and amplitude alignment 125 has low(er) power handling capabilities, in which case phase and amplitude alignment 125 may not be placed after a shared driver amplifier that may increase signal power beyond its capabilities. Peaking driver 130 may be implemented, for example, by GaAs technology.

Carrier driver 135 may receive carrier path signal 127 and carrier driver gate bias 122, e.g., from phase and amplitude alignment 125. Carrier driver 135 may amplify carrier path signal 127. Performance of carrier driver 135 may be controlled, at least in part, by carrier driver gate bias 122. Carrier driver 135 may be optional in some implementations. Carrier driver 135 may be implemented, for example, when phase and amplitude alignment 125 has low(er) power handling capabilities, in which case phase and amplitude alignment 125 may not be placed after a shared driver amplifier that may increase signal power beyond its capabilities. Carrier driver 135 may be implemented, for example, by GaAs technology.

Peaking amplifier 140 may receive peaking path signal 126 and peaking amplifier gate bias 116. Peaking amplifier 140 may amplify peaking path signal 126, which may have been amplified by peaking driver 130. Performance of peaking amplifier 140 may be controlled, at least in part, by peaking amplifier gate bias 116. Peaking amplifier 140 may be biased, for example, as a Class C amplifier, e.g., to provide Doherty load modulation performance. Peaking amplifier 140 may be biased the same or differently (e.g. in one or more other classes) in other implementations. Peaking amplifier 140 may be implemented, for example, by GaN or LDMOS technology, e.g., for high power implementations of Doherty amplifiers.

Carrier amplifier 145 may receive carrier path signal 127 and carrier amplifier gate bias 121. Carrier amplifier 145 may amplify carrier path signal 127, which may have been amplified by carrier driver 135. Performance of carrier amplifier 145 may be controlled, at least in part, by carrier amplifier gate bias 121. Carrier amplifier 145 may be biased, for example, as a Class AB amplifier, e.g., to provide Doherty load modulation performance. Carrier amplifier 145 may be biased the same or differently (e.g. in one or more other classes) in other implementations. Carrier amplifier 145 may be implemented, for example, by GaN or LDMOS technology, e.g., for high power implementations of Doherty amplifiers.

Peaking offset line 150 may comprise an offset transmission line in the peaking path. Peaking offset line 150 may receive peaking path signal 126, which may have been amplified by peaking driver 130 and peaking amplifier 140. Peaking offset line 150 may be implemented, for example, as a transmission line or lumped components in the peaking path. A peaking offset line may be implemented, for example, e.g., in part, to provide high impedance when the peaking amplifier is OFF under back off conditions. A peaking offset line may, e.g., effectively, rotate the phase of parasitic or non-ideal impedance to that of an open circuit.

Carrier offset line 155 may comprise an offset transmission line in the carrier path. Carrier offset line 155 may receive carrier path signal 127, which may have been amplified by carrier driver 135 and carrier amplifier 145. Carrier offset line 155 may be implemented, for example, as a transmission line or lumped components in the peaking path. Carrier offset line 155 may present the amplified load impedance under back off conditions (e.g. 100 Ohms) to the current source of a carrier amplifier transistor.

Impedance inverter 160 may be implemented between a carrier and peaking path. Impedance inverter 160 may comprise, for example, a 50 Ohm characteristic impedance transmission line with a length of lambda/4 (i.e. ¼λ). Impedance inverter 160 may be implemented, for example, as a transmission line or lumped components.

Load match 165 may comprise a load matching transmission line. Load match 165 may be implemented, for example, as a transmission line or lumped components.

Impedance modulation may be achieved by a Doherty amplifier output combining network, e.g., peaking offset line 150, carrier offset line 155, impedance inverter 160 and load match 165. Continuing with an example of a balanced Doherty amplifier, load matching transmission line 165 may be, for example, a 35 Ohm characteristic impedance transmission line with length of ¼λ. Load matching transmission line 165 may take a 50 Ohm load and convert it to 25 Ohms. Impedance inverter 160 may be, for example, a 50 Ohm characteristic impedance transmission line with length of ¼λ. Impedance inverter 160 may take the 25 Ohms and convert it to 100 Ohm impedance. This may occur, for example, during back off conditions when the peaking path is OFF, e.g., due to Class C bias of a peaking amplifier.

As previously indicated, carrier amplifier 145 may be biased, for example, as a Class AB amplifier while peaking amplifier 140 may be biased, for example, as a Class C amplifier. In an example Doherty amplifier 100 with an example signal condition where an input has low(er) signal power, carrier amplifier 145 may be operational (e.g. ON) while peaking amplifier 140 may be turned OFF, e.g., due to class C operation of peaking amplifier 140. Carrier amplifier 145 may be presented with higher impedance (e.g. 100 Ohms for a balanced 1:1 Doherty), for example, when peaking amplifier 140 is OFF. A higher impedance may allow a signal voltage to swing higher and make better use of available power supply voltage.

In an example Doherty amplifier 100 with an example signal condition where an input has high(er) signal power, carrier amplifier 145 may be operational (e.g. ON) while peaking amplifier 140 may also be operational (e.g. ON). For example, signal power increasing from a lower level to a higher level may turn peaking amplifier 140 ON while signal power decreasing back to a lower level may turn peaking amplifier 140 OFF again.

In an example when peaking amplifier 140 turns ON, impedance presented to carrier amplifier 145 may decrease. In an example when a signal is at maximum power, both carrier and peaking amplifiers 145, 140 may be completely turned ON. The impedance presented to each of carrier and peaking amplifiers 145, 140 may be, for example, equal, e.g., 50 Ohms, which may achieve a maximum efficiency of operation (e.g. theoretical efficiency is 78% for Class B operation of an amplifier). Impedance modulation, e.g., from 100 Ohms to 50 Ohms, for example in a balanced Doherty amplifier, may occur with coherence as a peaking amplifier is turned on.

Under signal back off conditions, when peaking amplifier 140 is OFF, it may present an open circuit, which may be due, at least in part, to peaking offset line 150. Peaking offset line 150 may phase translate parasitic phase to an open circuit. Under signal back off conditions, the entire 100 Ohm impedance may be presented to carrier Amplifier 145, which may be due, at least in part, to carrier offset line 155. Carrier offset line 155 may translate a parasitic phase so that the 100 Ohms is presented at the drain of a transistor in carrier amplifier 145. Voltage swing may be doubled, for example, due to twice the impedance, e.g., from 50 to 100 Ohms), which may provide better efficiency. In an example Doherty amplifier with an operating condition when signal power is 6 dB below the maximum, signal swing may achieve the same saturated efficiency as an operating condition of maximum signal power.

Both carrier and peaking amplifiers 145, 140 may be presented 50 Ohms, with their parallel equivalent of 25 Ohms showing up at one end of load matching transmission line 165, for example, when signal power is at its maximum. Load matching transmission line 165, e.g., with 35 Ohm characteristic impedance, may convert this 25 Ohms to 50 Ohms to match the load impedance. Impedance inverter 160 may be an effective "pass through" and may not translate impedance, for example, because its 50 Ohm characteristic impedance matches the 50 Ohm impedance at the output of carrier amplifier 145.

Figure 2:
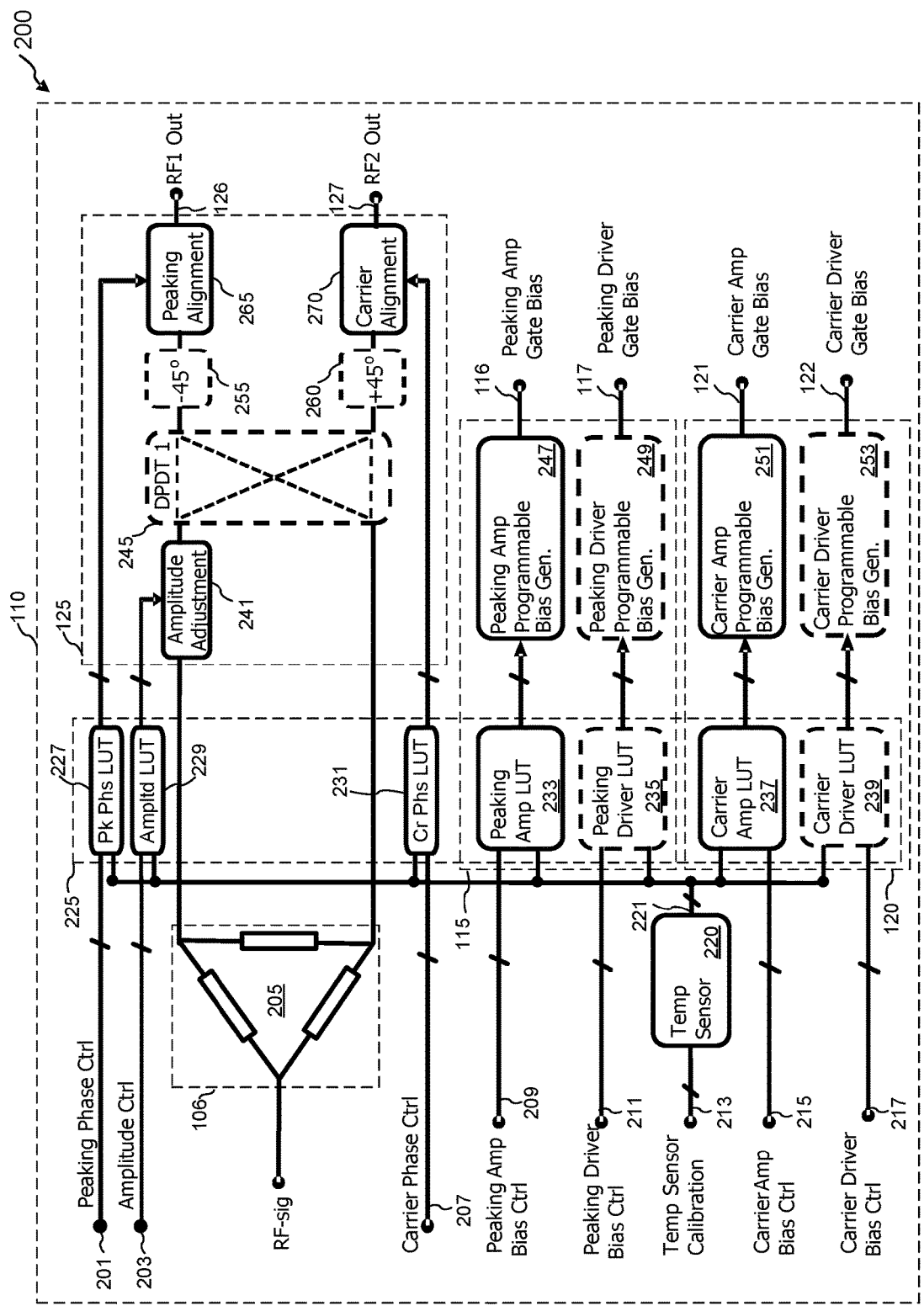
FIG. 2 is an example of configurable architecture and control circuitry.

FIG. 2 is an example of configurable architecture and control circuitry. As indicated in FIG. 2, example architecture 200 presents an example of configuration, control and optimization circuitry 110 shown in FIG. 1. Example architecture 200 is one of many examples of the described technology for a variety of devices, including Doherty amplifiers.

Example architecture 200 may be configurable (e.g. reconfigurable), for example, to provide selectability between both symmetric and asymmetric power amplifier (PA) architectures and/or both classic and inverted power amplifier (PA) architectures, which may be in addition to controllable operating parameters (e.g. phase, amplitude and gate bias) to provide performance control, calibration and optimization. In example architecture 200 showing a dual-path architecture of Doherty amplifier 100, first double pole double throw (DPDT) switch 245 is shown in carrier and peaking paths accompanied by a phase changer (e.g. +/−45 degree blocks 255, 260) and power changer (e.g. amplitude adjuster 241). This example architecture permits control of a power symmetry relationship, a phase offset relationship and a polarity of the phase offset relationship, permitting definition of which output port receives a higher power signal in an asymmetric architecture and which port receives a leading or lagging signal. The example of configurability shown in FIG. 2 is one of many example implementations for example Doherty amplifier 100, other Doherty amplifiers and other amplifiers and devices.

Example architecture 200 may provide controllable operating parameters (e.g. phase, amplitude and gate bias) to provide performance control, calibration and optimization for one or more configurable architectures. In example architecture 200, phase, amplitude and gate bias control may be provided by amplitude adjustment 241, peaking and carrier phase alignment 265, 270, peaking and carrier gate bias control 115 with compensation and/or calibration provided by temp sensor 220. Programmable logic may be provided, for example, by control logic 225, which may implement one or more algorithms for independent and/or interdependent operating parameters.

Control for gate bias control, phase control, amplitude control, temp control, etc. may be converged and integrated. One or more algorithms may account for one or more (e.g. all) components, variables and parameters, e.g., gate bias, output combiner, input phase alignment, etc., for a design environment and/or production-use environment. Control logic may be implemented, for example, using a programmable look up table (LUT). An LUT-based algorithm may be implemented using memory programmable one or more times (e.g. MOS ROM) to map variables to control data for parameters, such as phase, amplitude, gate bias and temperature compensation, e/g/, to provide optimal linearity, efficiency, gain, etc. for carrier and peaking paths. An embedded LUT or other logic may permit mapping to control data that compensates and optimizes performance for process, temperature and frequency based variations.

Example architecture 200 may, for example, be monolithically integrated onto a single IC, which may (e.g. also or alternatively) comprise pre-driver(s), driver(s) and/or other components not shown in FIG. 2. A final stage, e.g., carrier and peaking amplifiers 140, 145 shown in FIG. 1, may be implemented discretely, for example, with peak power-handling capability of 100 W or more. A final stage may be implemented, for example, as a discrete transistor based design, e.g., using LDMOS or GaN technologies. Integration of example architecture 200 may provide a holistic approach to performance optimization. Distributed implementation of gate biasing, phase alignment, amplitude alignment, temperature sensing compensation, control logic and configurability across multiple ICs may result in conflicts between independent optimization loops. A synergistic (integrated) optimization platform may permit limiting of dynamic control ranges and avoid optimization loop conflicts, which may yield improved overall performance.

Example architecture 200 may be implemented with different versions of circuitry 110. A first (e.g. design/development) version may have extended configurability (e.g. a greater versatility with greater dynamic range to adapt to configurable symmetric and asymmetric, classic and inverted architectures), control and/or tuning range compared to a second (e.g. production) version. Different versions may be pin compatible ICs, one with more configurability or adjustment range(s), perhaps with increased insertion loss, for a design phase that may be replaced by another version with less configurability and/or adjustment range(s), perhaps with lower insertion loss, for production. Pin compatibility may reduce R&D, e.g., reducing complexity/changes in transitioning from design to production.

Signal path divider 106 may be implemented, for example, by power divider 205, which divides input RF-sig into carrier and peaking path signals. In an example, the phase difference between power divider outputs (e.g. peaking and carrier path signals) may be zero (e.g. the same phase), for example, compared to a 90 degree phase difference between outputs. A configuration of signal path divider 106 (e.g. in terms of output phase, polarity and symmetry) may depend, for example, on features in various implementations, which may include reconfigurability of circuitry 110. In an example, power division may be asymmetric or unbalanced, e.g., providing more power to the peaking path than to the carrier path, e.g., compared to symmetric or balanced architecture. An asymmetric power split may permit both asymmetric and symmetric configurations, for example, by using amplitude adjustment 241 to attenuate a signal in the peaking path to match the power of a signal in the carrier path to reconfigure an asymmetric configuration to a symmetric configuration. In other implementations, signal path divider 106 may be reconfigurable for both symmetric and asymmetric architectures and/or different phases and polarities. Signal path divider 106 may be implemented, for example, by an asymmetric hybrid coupler that supports N-path architectures.

Configuration, control and optimization circuitry 110 may be controlled by one or more control signals, which may control one or more operating parameters. Control and signaling may be external or partially or fully internal to circuitry 110. Control may be analog, digital or a combination thereof, which may include software, firmware, logic gates and/or memory.

Control signal inputs may comprise, for example, peaking phase control 201, amplitude control 203, carrier phase control 207, peaking amplifier bias control 209, peaking driver bias control 211, temperature sensor calibration 213, carrier amplifier bias control 215 and carrier driver bias control 217.

In an example, e.g., as shown in FIG. 2, control signal inputs may be digital. These control signal inputs (e.g. each being one or more bits) may be set external to circuitry 110. For example, control signal inputs may be provided by computer executable instructions. In an example, the instructions may be executed during a design phase based on programmed instructions from a designer (e.g. engineer) using a graphical user interface to optimize performance. In another example, the instructions may be executed during post-design operation based on pre-programmed instructions.

Control signal inputs may be determined (e.g. optimized), for example, by calculating or empirically determining and testing performance. Operating parameters may be independently and/or collectively optimized over a variety of operating conditions (e.g. varying temperatures). In an example, control signals (e.g. phase control bits 201, 203), may be set for an optimal phase control irrespective of settings for other parameters. Calibration may be provided, for example, based on temperature sensor calibration 213, by calibrating control inputs before providing them to circuitry 110 and/or other calibration techniques.

Temperature sensor 220 may be integrated in (e.g. on chip with) circuitry 110, for example, to improve accuracy in detecting and calibrating based on operating conditions. Temperature sensor calibration 213 may be used, for example, to calibrate temperature sensor 220. An output 221 of temperature sensor 220 may be a factor used to determine operating parameters, for example, by using temperature sensor output 221 to determine or calibrate control data, as shown in the example in FIG. 2. Temperature sensor output 221 may be provided to control logic 225, which may be distributed to sub logic in control logic 225.

Temperature sensor control may provide compensation to calibrate Doherty amplifier and/or temperature sensor, e.g., based on sensor location, process, temperature and/or frequency variation.

Control logic 225 may comprise logic that controls, for example, operating parameters such as phase, amplitude, gate bias and may control configuration, calibration, etc. for circuitry 110. Control logic may comprise, for example, logic gates and/or memory. In an example, control logic 225 may comprise one or more look up tables (LUTs). Control logic 225 may comprise, for example, one or more memories storing a plurality of control data sets. Control data sets may be selected by providing addresses to one or more memories storing respective data sets. Addresses for data sets may be provided, for example, by one or more control signal inputs 201, 203, 207, 209, 211, 215, 217 and/or other internal or external signals, e.g. temperature sensor output 221. Memories may be statically or dynamically programmable (e.g. using one time programmable (OTP) or multi time programmable (MTP) memory) to provide one or more logic sets, with each logic set comprising one or more control data sets. For example, changing a configuration of circuitry 110 may lead to reprogramming logic provided by one or more memories in control logic 225. In another example, multiple sets of control data may be available to program one or more memories in control logic 225 for development, configuration, testing, comparison, calibration, device or control versioning and/or optimization. In other implementations, control logic 225 may comprise fixed or variable analog and/or digital circuitry.

Control logic 225 may provide control data sets using monolithic logic or may be divided into sublogic. In an example shown in FIG. 2, sublogic units are provided, e.g., as indicated by peak phase LUT 227, amplitude LUT 229, carrier phase LUT 231, peaking amplifier LUT 233, peaking driver LUT 235, carrier amplifier LUT 237 and carrier driver LUT 239. Whether implemented as monolithic LUT or sub LUTs, control logic 225 may generate (e.g. map) output control data set patterns responsive to control signal input patterns or codes (control codes). An LUT or other memory may reduce the number of input control bits, e.g., compared to using input control bits to directly control operating parameters, configuration and/or calibration of circuitry 110. For example, eight input control bits may address 256 control data patterns to adapt performance to various configurations and operating conditions.

Peak phase LUT 227 sublogic output may control peaking alignment 265. Amplitude LUT 229 sublogic output may control amplitude adjustment 241. Carrier phase LUT 231 sublogic output may control carrier alignment 270. Peaking amplifier LUT 233 sublogic output may control peaking amplifier programmable bias generator 247. Peaking driver LUT 235 sublogic output may control peaking driver programmable bias generator 249. Carrier amplifier LUT 237 sublogic output may control carrier amplifier programmable bias generator 251. Carrier driver LUT 239 sublogic output may control carrier driver programmable bias generator 253. One or more of these sub LUTs may be merged into one or more larger LUTs, for example, to account for inter and/or intra dependence logic. In an example, one or more operating parameters may be dependent on one or more other operating parameters for one or more configurations or operating conditions of circuitry 110.

Circuitry 110 may comprise one or more controlled elements, modules, subcircuits, components, etc., which may be controlled for configuration, calibration, operation, etc. In the example shown in FIG. 2, controlled components include amplitude adjustment 241, peaking amplifier programmable bias generator 247, peaking driver programmable bias generator 249, carrier amplifier programmable bias generator 251, carrier driver programmable bias generator 253, peaking alignment 265 and carrier alignment 270. Switch 245, peaking phase change 255 and carrier phase change 260 are shown as optional components. Switch 245 is controlled. Although shown as fixed, path divider 106, peaking phase change 255 and carrier phase change 260 may be fixed or controlled in various implementations. Other implementations may have the same or different, more or fewer controlled components.

Amplitude adjustment 241 may provide attenuation and/or amplification. Amplitude adjustment 241 may provide amplitude alignment and/or amplitude change. An amplitude change may comprise, for example, a range of amplitude adjustment sufficient to change the symmetry relationship of carrier and peaking path signals, e.g., substantially change peaking signal amplitude to change the relationship of peaking and carrier signals, e.g., change a symmetry ratio from 3:1 to 2:1 or from asymmetric to symmetric or vice versa. An amplitude change range of adjustment may, for example, support reconfiguration of an asymmetric output of path divider 106 to a symmetric relationship, e.g., by attenuating the peaking signal. An amplitude alignment may provide less range of adjustment than amplitude change range, for example to make less significant changes for purposes of alignment with a particular asymmetry or symmetry without substantially changing the symmetry relationship of peaking and carrier signals.

Amplitude adjustment 241 may be implemented, for example, by an attenuator, such as a digital step attenuator (DSA). In an example, such as the example shown in FIG. 2, amplitude adjustment 241 may be implemented (e.g. only) on the peaking path. Amplitude adjustment may be associated with a cost, such as insertion loss. Unnecessary insertion loss may be avoided, for example in the carrier path, by limiting amplitude adjustment to the peaking path. An asymmetric power split and peaking path attenuator may provide sufficient flexibility/adaptability of circuitry 110 for various architectures and configurations while minimizing insertion loss.

In an example of an asymmetric power split, e.g., by signal path divider 106, more power may be provided to the peaking path than to the carrier path. Examples of asymmetric power ratio may be 2:1 or 3:1. For example, an attenuator (e.g. DSA) in the peaking path may be engaged or controlled (e.g. to provide amplitude change as opposed to merely alignment) to reduce the power of the peaking path from 3:1 to a 2:1 or a 1:1 (symmetric) architecture or configuration, substantially changing the symmetry relationship of peaking and carrier path signals. An attenuator (e.g. DSA) may (e.g. also) be used to compensate and/or calibrate for any mismatches to maintain alignment based on an expected power ratio between peaking and carrier paths.

Amplitude control (e.g. via DSA, such as 0.5 dB steps with a range of 3.5 dB) may permit programming for various (e.g. 2, 2.5, 3-way) configurations and alignment with a carrier path for process variations.

Peaking alignment 265 and carrier alignment 270 may provide a range of adjustment less than a phase change range, for example to maintain (e.g. align or compensate for parasitics and other non-idealities) rather than change a phase offset relationship between carrier and peaking signals without substantially changing the phase relationship from a first expected phase relationship to a second expected phase relationship (e.g. in-phase, classic or inverted phase relationship). Peaking alignment 265 and carrier alignment 270 may realize phase shift and control to offset the phase between the peaking and carrier paths to account for non-idealities, which may occur, for example, in the output combiner network (e.g. mismatch of offset lines 150, 155, impedance inverter 160 and load matching transmission line 165 for one or more operating conditions). For example, phase alignment may be utilized when offset lines 150, 155, differ in value. A production version may, for example, address alignment, e.g. at least in part, at the input of a Doherty amplifier. As another example why phase alignment may be utilized, peaking and carrier final stage amplifiers may undergo different phase shift due to different bias conditions. These and/or other non-idealities in design, implementation (process, integration), operation (e.g. temperature variations) variations may lead to phase compensation between carrier and peaking input paths to maintain performance (e.g. optimized linearity and efficiency). Peaking and carrier phase alignment 265, 270 may be implemented, for example, by passive variable (e.g. controllable) components.

Phase control (e.g. for alignment in carrier and peaking paths) may be implemented in continuous or discrete steps (e.g. +/−1, 2, 3, 4, 5 degree steps). In an example, peaking alignment 265 and carrier alignment 270 may (e.g. each) have a range of 75 degrees with 5 degree discrete steps.

Peaking phase change 255 and carrier phase change 260 may provide a range of adjustment greater than a phase alignment range of adjustment, for example to change from a first phase offset relationship to a second phase offset relationship (e.g. in-phase, classic or inverted phase relationship) between carrier and peaking signals. In the example shown in FIG. 2, peaking phase change 255 and carrier phase change 260 are shown as −/+45 degree phase, respectively, collectively providing a 90 degree phase offset relationship between peaking and carrier signals. Other implementations may have the same or different phase change and positioning relative to other components. For example, peaking phase change 255 may be zero degrees and carrier phase change may be 90 degrees.

In an example, signal path divider 106 may output in-phase peaking and carrier path signals. Other implementations of signal path division may provide the same or different phase offset relationship. In an example, a phase offset may be introduced after one or more potential architectural or configuration changes, such as amplitude adjustment 241 being configurable to change symmetry and/or switch 245 being configurable to change signal paths. A phase offset may be introduced before phase alignment, e.g., to permit corrections to maintain an expected phase offset relationship. Other implementations may have the same or different relative arrangement of components shown in the example in FIG. 2.

Switch 245 may be controlled to provide configurable (e.g. reconfigurable) architecture. Switch 245 may comprise, for example, one or more multi pole, multi throw (MPMT) switches commensurate with an N-path architecture. Switch(es) may, for example, provide support for N-way (e.g. 2-way, 2.5-way, 3-way) architectures, provide a choice between classic/inverted Doherty architectures, provide path amplitude control for symmetric and asymmetric architectures and/or may permit higher than 6 dB peak to average ratio (PAR) signals and increased gain from peaking path.

Switch 245 may be implemented, for example, by an open reflective double pole double throw (DPDT) switch. Other N-path splits may realize reconfigurability by implementing one or more switches. Switch 245, for example, may be controlled with multiple states. A first state of switch 245 may maintain peaking and carrier paths. A second state of switch 245 may swap (e.g. switch) peaking and carrier paths. Switching paths may allow for a higher power signal to be routed to a path with a leading phase or lagging phase, for example, when a phase offset relationship may be fixed. In an example, a selectable phase offset relationship may be provided (e.g. in addition to or alternative to) switch 245. Path selectability and/or phase offset selectability may provide programmable (reconfigurable) architecture, for example, between classic and inverted Doherty, which may be combined with fixed or selectable asymmetric architecture.

In an example, switch 245 may have two states. A first state may select a classic Doherty state. Peaking amplitude at RF1 Out may range, for example, from −4.5 dB to −8 dB. Carrier amplitude at RF2 Out may be −8 dB. Peaking signal at RF1 Out may lag carrier signal at RF2 Out by 90 degrees.

A second state may select an inverted Doherty state. Peaking amplitude at RF2 Out may range, for example, from −4.5 dB to −8 dB. Carrier amplitude at RF1 Out may be −8 dB. Carrier signal at RF1 Out may lag peaking signal at RF2 Out by 90 degrees.

Programmable Bias generators (e.g. peaking amplifier programmable bias generator 247, peaking driver programmable bias generator 249, carrier amplifier programmable bias generator 251, carrier driver programmable bias generator 253) may be controlled to provide gate bias voltages to, respectively, peaking amplifier 140, peaking driver 130, carrier amplifier 145 and carrier driver 135. In an example, control data provided to the bias generators by control logic 225 may be digital. The bias generators may have embedded digital to analog converters (DACs) to convert digital control data to analog voltages. The analog voltages may be provided (e.g. routed) to bias respective gates of amplifiers and drivers, e.g., as shown in the example in FIG. 1.

In an example, bias generators may comprise, for example, gate bias generators, drivers to supply gate voltages, DACs to provide bias control, negative voltage generators and protection options to properly biased depletion mode field effect transistors (FETs). Gate bias control and supply sequencing control (e.g. via digital serial peripheral interface (SPI) control) may prevent failures of depletion mode FETs. Depletion mode FETs may have a negative threshold. Excessive current may burn out a depletion mode FET, for example, when the goes to 0 V while drain is biased. Bias control and supply sequencing control may comprise power up/down, e.g., to avoid harmful conditions. Gate bias voltage control of carrier and peaking amps may help calibrate for process variations and/or variations in voltage for different RF channels and output power. For example, gate bias control may compensate for different RF channels with different voltages, e.g., different settings for the low end of an RF band versus a high end of an RF band. Gate bias control may compensate for voltage changes based on output power (e.g. class AB under max output power). Gate bias control compensation may be used to improve Doherty gain variation.

The example presented for a two path architecture may be scaled to N-Path architectures where there may be more than one carrier and/or peaking path. For example, the number of paths, amplifiers, drivers, programmable gate bias circuits, alignment circuits, switches, etc. may be scaled to the number N of paths.

Multiple versions of circuitry 110 may be pin compatible chips, which may reduce cost and time associated with research and development (R&D). E-Fuse, wirebond, metal mask and other IC variants may support optimization in design and production versions. A first version may provide maximum tuning range (e.g. for design-development) and a second version may have a lower insertional loss and less tuning range (e.g. for production-application). A greater range of operational adjustment, e.g., N-path amplitude and phase alignment, and/or a greater range of architectural reconfigurability (e.g. various symmetry, phase and polarity relationships) may be provided in a first (e.g. design) version relative to a second (e.g. production) version of circuitry 110. Various versions may be provided with different frequency ranges, e.g., 1.8 to 2.2 GHz, 2.3 to 2.7 GHz and 3.2 to 3.8 GHz, which may also be pin compatible.

Figure 3:
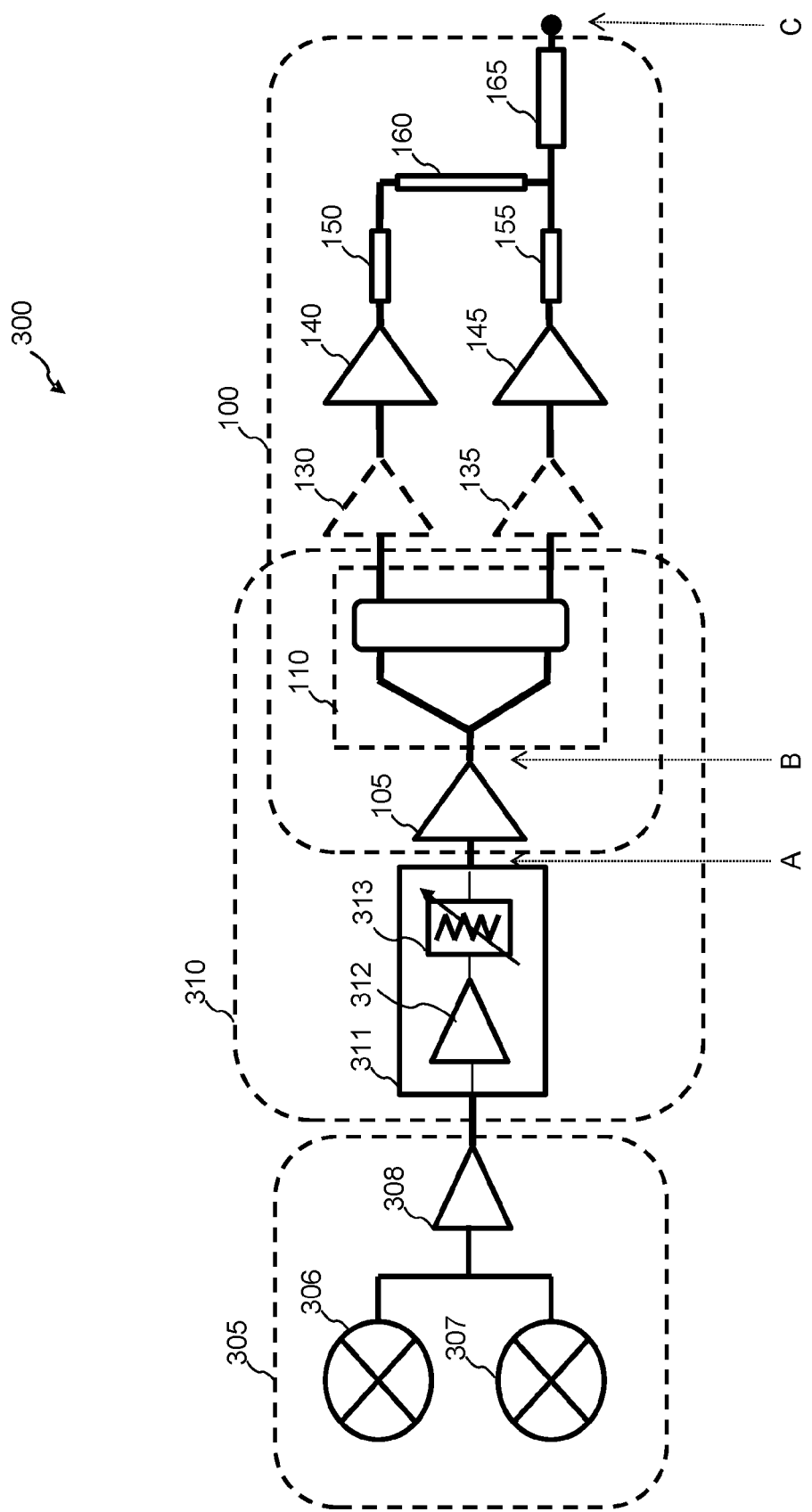
FIG. 3 is an example of configurable architecture and control circuitry between an RF transceiver and a Doherty power amplifier.

FIG. 3 is an example of configurable architecture and control circuitry between an RF transceiver and a Doherty power amplifier. Dashed boxes (e.g. 100, 110, 310, 305) may represent examples of circuitry that may be integrated, e.g., in an IC, system on a chip (SoC), etc. Example circuitry 300 may be implemented, for example, in a base station. Various implementations, e.g., for low power mid-power or high power applications, may implemented the same or differently. In an example, carrier and peaking path drivers 130, 135 may or may not be implemented in low and/or mid power applications. Low insertion loss, high pre-driver target compression (e.g. 1 dB) and power handling in Doherty alignment may be important factors in deciding whether to eliminate carrier and peaking path drivers 130, 135. A pre-driver may be deemed a driver amplifier located before a power splitter. A high compression point (e.g. for a hybrid coupler and phase and amplitude controller 110) may permit a low bill of materials (BoM) and improved integration. It may help avoid duplicate driver amplifiers in mid/low power macros. Pre-driver compression may be relaxed, for example, when implementing carrier and peaking path drivers 130, 135. SiGe, RF system on insulator (RFSOI) integration may be applied, for example, across Transmission (Tx) variable gain amplifier (VGA), pre-driver and circuitry 110.

An implementation may be based, at least in part, on a pre-driver target compression (e.g. 1 dB) and/or signal power at points A, B and/or C identified in FIG. 3.

RF modulator 305 may be implemented, for example, in an RF transceiver. RF modulator 305 may comprise, for example, quadrature mixers 306, 307 and output buffer 308. RF modulator 305 may up-convert the baseband or an intermediate frequency (IF) transmitted signal to RF frequencies. Quadrature mixers 306, 307 may respectively be in an in-phase path ("I" path) and a quadrature phase path ("Q" path). The outputs of quadrature mixers 306, 307 (I and Q signals) may be combined, e.g., in the form of combined current. Output buffer 308 may buffer and amplify the combined signal from quadrature mixers 306, 307.

Integration example 310 may integrate digital variable gain amplifier (DVGA) 311, pre-driver 105 and circuitry 110. DVGA 311 may comprise amplifier 312 (e.g. to amplify a signal from the transceiver) and gain control 313 (e.g. to provide gain control to change the output power of DVGA 311). Integration example 310 may be integrated, for example, in a monolithic IC, SoC or other integrated module. Integrated example 310 may be implemented, for example, on a transceiver card or power amplifier (PA) card with drivers (e.g. 130, 135) and final stage amplifiers (e.g. 140, 145). A modular approach that combines functions/circuitry between transceiver and PA may provide performance advantages, such as a reduced PCB foot-print and improved optimization, e.g., by using integrated (e.g. digital) control without driving excessive capacitance and/or by maintaining the signal in voltage/current mode inside an IC (e.g. as opposed to trying to match interfaces between each block when a signal comes off chip and back on chip).

The disclosed subject matter may be applicable, for example, to amplifiers (e.g. Doherty), RF products, LINC (linear amplifier with nonlinear components), quadrature modulation/demodulation, wireless infrastructure, base station products, etc.

Systems, methods and instrumentalities have been disclosed for Doherty amplifier optimization. Amplifier configurability and control therefore may be integrated. Amplitude alignment, phase alignment, amplifier gate biasing, driver gate biasing and temperature compensation for N paths in Doherty configurations may be integrated, for example, using a programmable LUT storing control bit patterns. Configurability may comprise reconfigurability between asymmetric power split ratios, between symmetric and asymmetric relationships and between classic and inverted phase relationships, permitting path reconfigurability for higher or lower power and leading or lagging phase. Multiple versions providing more or less configurability and/or control range with more or less insertion loss, such as design and production versions, may be pin compatible, e.g., to reduce time and expense for R&D and production transition. Integration of configurability and/or control may reduce complexity in design, development, control, optimization, production and application, e.g., by eliminating interfaces, mismatches or excessive capacitance between discrete chips.

Devices may be digital, analog or a combination thereof. Devices may be implemented with any one or more semiconductor processes or semiconductor technology, including one or more of BJT, HBT, MOSFET, MESFET, CMOS, BiCMOS, RF SOI or other transconductor or transistor technology. Implementation with different technologies may require alternative configurations other than the configuration illustrated in embodiments presented herein, which is within the knowledge of one of ordinary skill. Devices may be implemented in any discrete or integrated circuit fabrication technology, including but not limited to Silicon-Germanium (SiGe) semiconductors or other semiconductors comprising other materials and alloys.

A device may comprise, for example but not limited to, a switch or any device having a switch, e.g., an amplifier, attenuator, digital step attenuator, intermediate frequency (IF) device, radio frequency (RF) device, wireless device, communications device, radio system, receiver, transmitter, transceiver, cellular base station equipment and other communications and wireless infrastructure equipment, etc. For example, embodiments of the disclosed subject matter may be implemented in one or more IF and RF stages of receivers, transmitters and transceivers. Devices may be digital, analog or a combination thereof. Digital devices may have one or a plurality of programming modes, e.g., serial, parallel, latched parallel, for a plurality of different programming and control implementations.

Techniques described herein may be implemented in hardware (digital and/or analog) or a combination of hardware, software and/or firmware. Techniques described herein may be implemented in one or more components. Embodiments of the disclosed subject matter may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media.

Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions (e.g. a microprocessor or micro controller with instructions in embedded memory) that, when executed, provide and/or maintain one or more aspects of functionality described herein with reference to FIGS. 1-13, as well as any and all components, steps and functions therein and/or further embodiments of the present technology described herein. While the disclosed technology has been described with respect to a limited number of examples, it should be understood that they have been presented by way of example only, and not limitation. It will be understood by those skilled in the relevant art(s) that the spirit and scope of the subject matter of the present application encompasses a wide variety of implementations, including various changes in form and details to disclosed examples.

Embodiments are not limited to the functional blocks, detailed examples, steps, order or the entirety of subject matter presented in the examples. An embodiment of a device, apparatus or machine may comprise any one or more features described herein in any configuration. An embodiment of a method or process may comprise any process described herein, in any order, with any number of steps, using any modality.

Proper interpretation of subject matter described herein and claimed hereunder is limited to patentable subject matter under 35 U.S.C. § 101. As described herein and claimed hereunder, a procedure is a process defined by 35 U.S.C. § 101 and each of a circuit, device, apparatus, machine, system, computer, module, media and the like is a machine and/or manufacture defined by 35 U.S.C. § 101.

The exemplary appended claims encompass examples and features described herein, modifications and variations thereto as well as additional examples and features that fall within the true spirit and scope of the disclosed subject matter.

What is claimed:

1. A device comprising:
   a signal path splitter providing a split signal path comprising a signal path A split into N-paths comprising a signal path B and a signal path C with a symmetry relationship, a phase relationship and a polarity relationship between the signal paths B and C that are selectively reconfigurable by a reconfigurable symmetry, a reconfigurable phase and a reconfigurable path; and
   a reconfigurable symmetry providing selective reconfiguration of the symmetry relationship between the signal paths B and C by providing selective amplification or attenuation;
   a reconfigurable phase providing selective reconfiguration of the phase relationship between the signal paths B and C; and
   a reconfigurable path providing selective reconfiguration of the polarity relationship between the signal paths B and C.

2. The device of claim 1, wherein the reconfigurable path is provided after the reconfigurable symmetry.

3. The device of claim 2, wherein the reconfigurable symmetry selectively provides gain and attenuation.

4. The device of claim 3, wherein the symmetry relationship, the phase relationship and the polarity relationship provided by the signal path splitter is based on reconfigurability provided by the reconfigurable symmetry, the reconfigurable path and the reconfigurable phase.

5. The device of claim 4, wherein the reconfigurable phase is provided after the reconfigurable path.

6. The device of claim 5, further comprising:
a phase aligner that selectively refines a phase of at least one of the signal paths B and C, wherein the phase aligner is provided after the reconfigurable phase.

7. The device of claim 6, wherein the reconfigurable symmetry is provided in only one of path B and path C.

8. The device of claim 6, further comprising:
an amplitude aligner that selectively refines an amplitude of at least one of the signal paths B and C, wherein the amplitude aligner is provided after the reconfigurable symmetry.

9. The device of claim 8, further comprising:
an amplifier gate bias generator providing an amplifier B gate bias to an amplifier of a signal on the path B and an amplifier C gate bias to an amplifier of a signal on the path C.

10. The device of claim 9, further comprising:
a driver gate bias generator providing a driver B gate bias to a driver of a signal on the path B and a driver C gate bias to a driver of a signal on the path C.

11. The device of claim 10, further comprising:
an integrated logic controlling the phase aligner, the amplitude aligner, the amplifier gate bias generator and the driver gate bias generator.

12. The device of claim 11, further comprising:
an integrated temperature sensor calibrating or compensating the integrated logic controlling the phase aligner, the amplitude aligner, the amplifier gate bias generator and the driver gate bias generator.

13. The device of claim 12 implemented on one integrated circuit.

14. The device of claim 1 comprising one of a set of two or more pin-compatible devices having a developmental version device and a production version device, wherein the developmental version device provides a wider range of adjustment to determine an optimal configuration and higher insertion loss compared to the production version device that implements the determined optimal configuration with less insertion loss than the developmental version device.

15. An integrated circuit comprising:
a signal path splitter providing a split signal path comprising a signal path A split into N-paths comprising a signal path B and a signal path C with a symmetry relationship, a phase relationship and a polarity relationship between the signal paths B and C that are subsequently selectively reconfigurable in the integrated circuit;
a phase control providing selective adjustment of a phase of at least one of the signals on the signal paths B and C to maintain a phase relationship between the signals on the signal paths B and C; and
a reconfigurable path providing selective reconfiguration of the polarity relationship between the signal paths B and C.

16. The integrated circuit of claim 15, further comprising:
a reconfigurable symmetry providing selective reconfiguration between a symmetric and an asymmetric signal power relationship between the signals on the signal paths B and C.

17. The integrated circuit of claim 15, further comprising:
a reconfigurable phase that provides selective reconfiguration of a phase relationship between the signals on the signal paths B and C including selectively changing a polarity of the phase relationship.

18. A device comprising:
a split signal path comprising a signal path A split into N-paths comprising a signal path B and a signal path C with a symmetry relationship, a phase relationship and a polarity relationship between the signal paths B and C that are selectively reconfigurable by the device, wherein the device comprises one of a set of two or more pin-compatible devices having a developmental version device and a production version device, wherein the developmental version device provides a wider range of adjustment to determine an optimal configuration and higher insertion loss compared to the production version device that implements the determined optimal configuration with less insertion loss than the developmental version device.

19. The device of claim 18, further comprising:
a reconfigurable symmetry providing selective reconfiguration between a symmetric and an asymmetric signal power relationship between the signals on the signal paths B and C.

20. The device of claim 19, further comprising:
an integrated logic that maintains a configured phase relationship and maintains a configured power relationship between signals on the paths B and C for the plurality of configurations resulting from the reconfigurable phase relationship and the reconfigurable power relationship.

* * * * *